(12) United States Patent
Hirooka et al.

(10) Patent No.: US 7,644,968 B2
(45) Date of Patent: Jan. 12, 2010

(54) SUBSTRATE HOLDING DEVICE

(75) Inventors: Yasuo Hirooka, Akashi (JP); Yasuhiko Hashimoto, Kobe (JP); Kei Watanabe, Kakogawa (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 431 days.

(21) Appl. No.: 10/586,654

(22) PCT Filed: Jan. 21, 2005

(86) PCT No.: PCT/JP2005/000781

§ 371 (c)(1),
(2), (4) Date: Aug. 14, 2006

(87) PCT Pub. No.: WO2005/071736

PCT Pub. Date: Aug. 4, 2005

(65) Prior Publication Data

US 2007/0216179 A1    Sep. 20, 2007

(30) Foreign Application Priority Data

Jan. 23, 2004    (JP) ............................. 2004-016179

(51) Int. Cl.
*B25J 15/00*    (2006.01)
*B65G 49/07*    (2006.01)
(52) U.S. Cl. ..................... 294/103.1; 294/902; 414/941
(58) Field of Classification Search ................. 294/1.1, 294/103.1, 119.1, 902; 414/936, 941
See application file for complete search history.

(56) References Cited

U.S. PATENT DOCUMENTS 5,700,046 A * 12/1997 Van Doren et al. ....... 294/119.1
6,155,773 A * 12/2000 Ebbing et al. ............ 414/744.5
6,216,883 B1 * 4/2001 Kobayashi et al. ........ 211/41.18
6,222,337 B1 * 4/2001 Kroeker et al. ......... 318/568.11
6,454,332 B1 * 9/2002 Govzman et al. .......... 294/64.1
6,513,848 B1 * 2/2003 Shendon et al. ............... 294/88
6,537,011 B1 * 3/2003 Wang et al. ................. 414/217
6,769,861 B2 * 8/2004 Caveney ..................... 414/783
7,048,316 B1 * 5/2006 Blank et al. .................. 294/1.1
7,300,082 B2 * 11/2007 Rogers et al. ............... 294/104

(Continued)

FOREIGN PATENT DOCUMENTS

JP    A-07-022502    1/1995

(Continued)

*Primary Examiner*—Dean J Kramer
(74) *Attorney, Agent, or Firm*—Oliff & Berridge, PLC

(57) ABSTRACT

A supporting structure is mounted on a hand body facing a circumferential edge of a substrate from below the substrate to support the substrate. First and second guiding members are mounted on the hand body, and having guiding surfaces in contact with an imaginary cylinder having an axis aligned with a reference axis of the hand body. First and second movable members are capable of moving in an imaginary plane perpendicular to the reference axis and are disposed on the radially outer-side of the circumferential edge of the substrate so as to face the circumferential edge. A driving unit simultaneously displaces the first and second movable members in the imaginary plane. The first and second guiding members and the first and second movable members are spaced apart on the circumference of the imaginary cylinder at intervals greater than the length of the arc of a segment in a substrate holding state.

7 Claims, 12 Drawing Sheets

U.S. PATENT DOCUMENTS

2002/0071756 A1* 6/2002 Gonzalez .................... 414/941

FOREIGN PATENT DOCUMENTS

| | | |
|---|---|---|
| JP | A-11-116046 | 4/1999 |
| JP | A-2000-183133 | 6/2000 |
| JP | A-2002-520860 | 7/2002 |
| JP | A 2003-142572 | 5/2003 |
| JP | A-2003-258076 | 9/2003 |
| WO | WO 00/03467 A2 | 1/2000 |

* cited by examiner

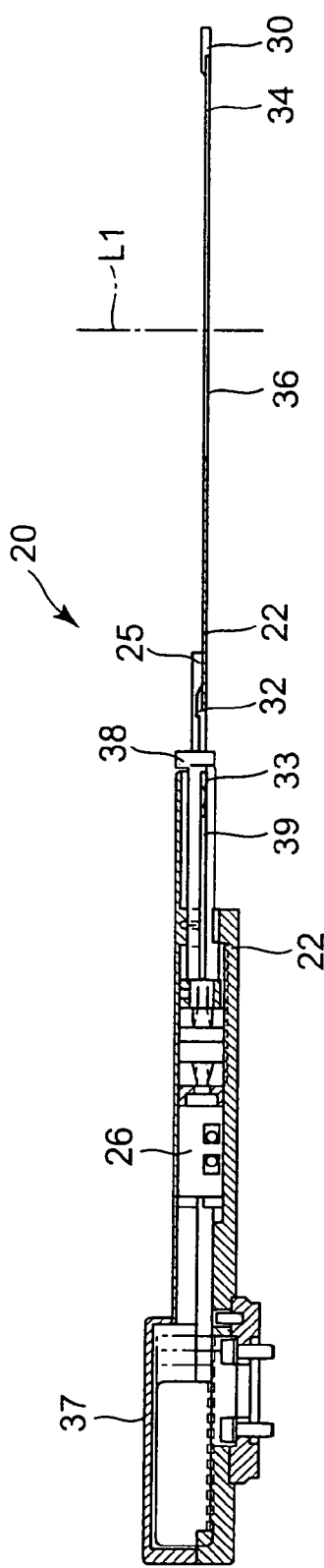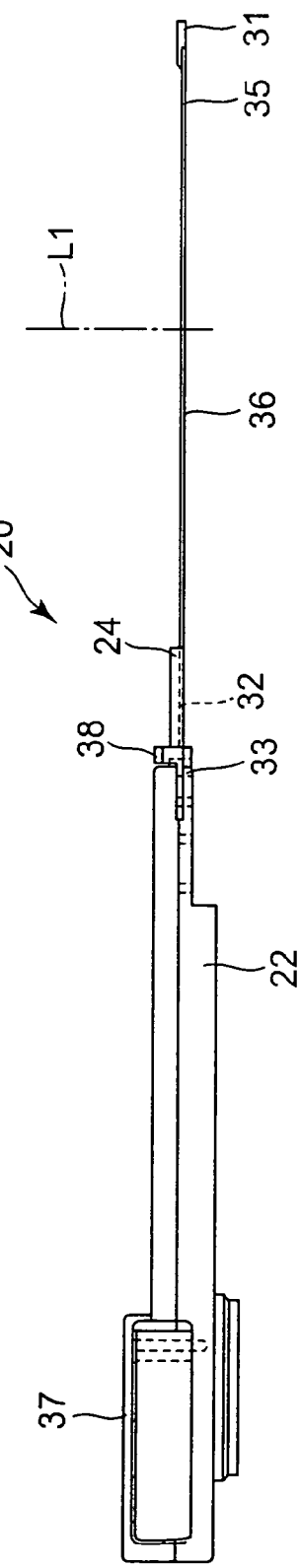
FIG. 3
FIG. 4

SUBSTRATE HOLDING DEVICE

CROSS REFERENCE TO RELATED APPLICATION

This application is based upon and claims the benefit of priority from the prior Japanese Patent Application No. 2004-16179, the entire contents of which are incorporated herein by reference.

TECHNICAL FIELD

The present invention relates to a substrate holding device for holding a disk-shaped substrate.

BACKGROUND ART

A robot hand for holding a disk-shaped semiconductor wafer is a known substrate holding device. The robot hand is joined to an end part of a robot arm included in an articulated robot and is used as an end effector. The robot hand located at a sending position by the robot arm holds a wafer and carries the wafer to a receiving position.

A first known robot hand disclosed in, for example, JP 2000-183133 A holds a wafer seated thereon by suction. A second known robot hand disclosed in, for example, JP 2002-520860 A supports a wafer seated thereon by holding the wafer by the three edge parts thereof.

DISCLOSURE OF THE INVENTION

The first known robot hand comes into contact with a large part of one of the surfaces of the wafer. Therefore, in some cases, particles are raised and stick to the wafer when the first known robot hand holds the wafer. Consequently, wafers are contaminated and yield is reduced.

The first known robot hand has a big thickness. Therefore, it is difficult to insert the first known robot hand into a space between adjacent ones of wafers arranged at small pitches in a cassette and to dispose a suction part of the first known robot hand opposite to the back surface of the wafer.

The second known robot hand holds a wafer by the circumferential edge thereof and hence the wafer will not be easily contaminated. However, when the wafer is provided with an orientation flat, the second known robot hand cannot hold the wafer in a correct position.

An orientation flat for positioning a wafer is formed in the wafer by cutting a segment demarcated by an arc and a cord extending between the opposite ends of the arc from the wafer. If one of a plurality of support parts corresponds to the orientation flat, the support member corresponding to the orientation flat cannot come into any circumferential edge of the wafer. Consequently, the support parts cannot serve as positioning means for positioning the wafer at a reference position and the robot hand cannot hold the wafer in a correct position.

The robot hand cannot accurately carry the wafer to a predetermined position unless the wafer is held in a correct position. For example, the center of the wafer carried to an aligner is dislocated from the center of the aligner.

Accordingly, it is an object of the present invention to provide a substrate holding device capable of holding a substrate by the circumferential edge thereof and of correctly positioning the substrate even if a circumferential edge of the substrate is cut.

The present invention provides a substrate holding device for holding a substantially circular substrate having a circumferential cut part, comprising: a hand body having a predetermined reference axis; a supporting structure mounted on the hand body so as to face a circumferential edge of the substrate from below the substrate to support the substrate; first and second guiding members mounted on the hand body and respectively having guiding surfaces which are in contact with an imaginary cylinder having an axis aligned with the reference axis and having a radius equal to a radius of the substrate; first and second movable members capable of moving in an imaginary plane perpendicular to the reference axis and disposed on a radially outer side of the circumferential edge of the substrate so as to face the circumferential edge of the substrate; and driving means configured to simultaneously displace the first movable member and the second movable member in the imaginary plane, wherein the first guiding member, the second guiding member, the first movable member and the second movable member are spaced apart on a circumference of the imaginary cylinder at circumferential intervals each of which is greater than a length of an arc of a segment cut to form the circumferential cut part in a substrate holding state where the substrate is held by at least either of the first and the second guiding members and at least either of the first and the second movable members.

In the substrate holding device according to the present invention, it is preferable that each of the guiding surfaces of the first and the second guiding members has a radius of curvature substantially equal to the radius of the substrate and extends along the circumference of the imaginary cylinder.

In the substrate holding device according to the present invention, it is preferable that each of the first and the second movable members has a pressing surface having a radius of curvature substantially equal to the radius of the substrate and facing the circumferential edge of the substrate from the radially outer side of the substrate, the pressing surfaces extending along the circumference of the imaginary cylinder in the substrate holding state.

In the substrate holding device according to the present invention, it is preferable that the first guiding member and the first movable member are disposed in a point symmetrical positional relation with respect to the reference axis in the substrate holding state. The second guiding member and the second movable member are disposed in a point symmetrical positional relation with respect to the reference axis in the substrate holding state. A straight line extending between the first guiding member and the second movable member and a straight line extending between the second guiding member and the first movable member are disposed so as to be parallel to moving directions of the first and the second movable members in the substrate holding state.

In the substrate holding device according to the present invention, it is preferable that the supporting structure has a support surface for supporting the substrate thereon, the support surface sloping up outward along the radius of the imaginary cylinder. Each of the first and the second movable members has a pressing surface to be pressed against the substrate, the pressing surface sloping down outward along the radius of the imaginary cylinder.

In the substrate holding device according to the present invention, it is preferable that an open space is formed so as to open radially outward from the reference axis.

In the substrate holding device according to the present invention, it is preferable that the supporting structure includes three support members to be brought into contact with the substrate, the support members being respectively arranged around the reference axis at angular intervals of 180° or below, the first and the second movable members being disposed on circumferentially opposite sides, respectively, of one of the three support members, the first and the second guiding members being respectively mounted on remaining two support members.

In the substrate holding device according to the present invention, it is preferable that one of the three support members has a support surface of a circumferential length longer than the length of the arc of the segment cut off to form the circumferential cut part.

According to the present invention, in a state where the substrate is supported by the supporting structure, the movable members are moved toward the guiding members and at least one of the movable members comes into contact with the substrate. The movable members are moved further toward the guiding members to bring the substrate into contact with the guiding members. Thus the substrate can be positioned with its axis aligned with the reference axis. Thereby, the substrate thus correctly positioned can be held by the movable members and the guiding members.

The circumferential cut part of the substrate coincides with none of the first guiding member, the second guiding member, the first movable member and the second movable member or coincides with one of the first guiding member, the second guiding member, the first movable member and the second movable member. Therefore, the substrate can be held by at least three of the first guiding member, the second guiding member, the first movable member and the second movable member.

When the first guiding member coincides with the circumferential cut part, the substrate can be held and positioned by the second guiding member, the first movable member and the second movable member. When the first movable member coincides with the circumferential cut part, the substrate can be held and positioned by the first guiding member, the second guiding member and the second movable member. Thus the substrate can be held in alignment with the reference axis by at least three of the holding members regardless of the position of the circumferential cut part.

Thus the substrate holding device of the present invention can hold a substrate in an accurately positioned state without touching any parts of the substrate other than the circumferential edge of the substrate. For example, when the substrate holding device is used to hold a semiconductor wafer provided with an orientation flat to carry the semiconductor wafer to an aligner, the contamination of the wafer can be prevented and the wafer can be accurately centered on the aligner.

Each of the guiding surfaces of the first and the second guiding members has a radius of curvature substantially equal to the radius of the substrate. Therefore, when the substrate is moved toward the guiding members by the movable members, the circumferential edge of the substrate comes into close contact with the guiding surfaces of the guiding members. Thus the deviation of the axis of the substrate from the reference axis can be prevented and the substrate can be accurately held even if the circumferential cut part of the substrate coincides with either of the first and the second guiding members.

Since each of the pressing surfaces of the first and the second movable members has a radius of curvature substantially equal to the radius of the substrate, the pressing surfaces of the first and the second movable members come into close contact with the circumferential edge of the substrate when the movable members push the substrate for sliding. Thus the deviation of the axis of the substrate from the reference axis can be prevented and the substrate can be accurately held even if the circumferential cut part of the substrate coincides with either of the first and the second movable members.

The guiding members and the movable members are arranged such that the first guiding member and the first movable member are in a point symmetrical relation, the second guiding member and the second movable member are in a point symmetrical relation, and a straight line extending between the first stationary guide member and the second movable member and a straight line extending between the second guiding member and the first movable member are parallel in a state where the substrate is held by the guiding members and the movable members. Therefore, the movable members can move the substrate so that the axis of the substrate may move toward the reference axis. Even if the movable members push the substrate after the substrate has been positioned in alignment with the reference axis, the substrate can be restrained from further sliding. Therefore, the substrate can be positioned in alignment with the reference axis without requiring any complicated control operations for moving the movable members. Thus the substrate holding device is simple in construction.

The support surface of the supporting structure is inclined so as to ascend radially outward. Therefore, the circumferential edge of the substrate is in line or point contact with the support surface when the substrate is supported by the supporting structure. The movable members have the pressing surfaces inclined so as to descend radially outward. Therefore, the pressing surfaces are in line or point contact with the circumferential edge of the substrate when the movable members push the substrate. Thus the area of parts of the substrate in contact with the supporting structure and the movable members is small and hence the contamination of the substrate by the substrate holding device can be prevented. The substrate can be held by the movable members and the guiding members so as to be radially immovable. The substrate can be held by the movable members and the supporting structure so as to be vertically immovable. Thus the substrate can be securely held. The substrate will not be dislocated on the substrate holding device even if the substrate holding device holding the substrate moves at high speed.

The open space is formed so as to open radially outward from the reference axis. Therefore, a substrate can be removed from other substrate holding device provided with a holding shaft coaxial with the substrate and a substrate can be mounted on such a substrate holding device. For example, when the substrate holding device holding a semiconductor wafer carries the semiconductor wafer to an aligner, the substrate holding device of the present invention can be positioned such that a holding shaft included in the aligner extends through the open space to place the semiconductor wafer with its axis aligned with the axis of rotation of the aligner.

The substrate can be securely supported by the three support members by arranging the three support members at angular intervals not greater than 180°. The first and the second movable members are disposed on the circumferentially opposite sides, respectively, of one of the three support members, and the first and the second guiding members are disposed so as to correspond to the remaining two support members, respectively. Therefore any support members do not need to be disposed on the outer side of the first and the second movable members. Thus the hand body can be made small.

One of the three support members has a support surface of a circumferential length longer than the length of the arc of the segment cut off to form the circumferential cut part. Therefore, the substrate can be supported by the support member having a support surface of a circumferential length longer than the length of the arc of the segment cut off to form the circumferential cut part and at least one of the remaining two support members. Thus it can be avoided to support the substrate by only the remaining two support members so that the substrate can be securely supported.

BRIEF DESCRIPTION OF THE DRAWINGS

FIG. 3 is a sectional view taken on the line S3-S3 in FIG. 1;

FIG. 4 is a side elevation of the robot hand 20;

BEST MODE FOR CARRYING OUT THE INVENTION

Figure 1:
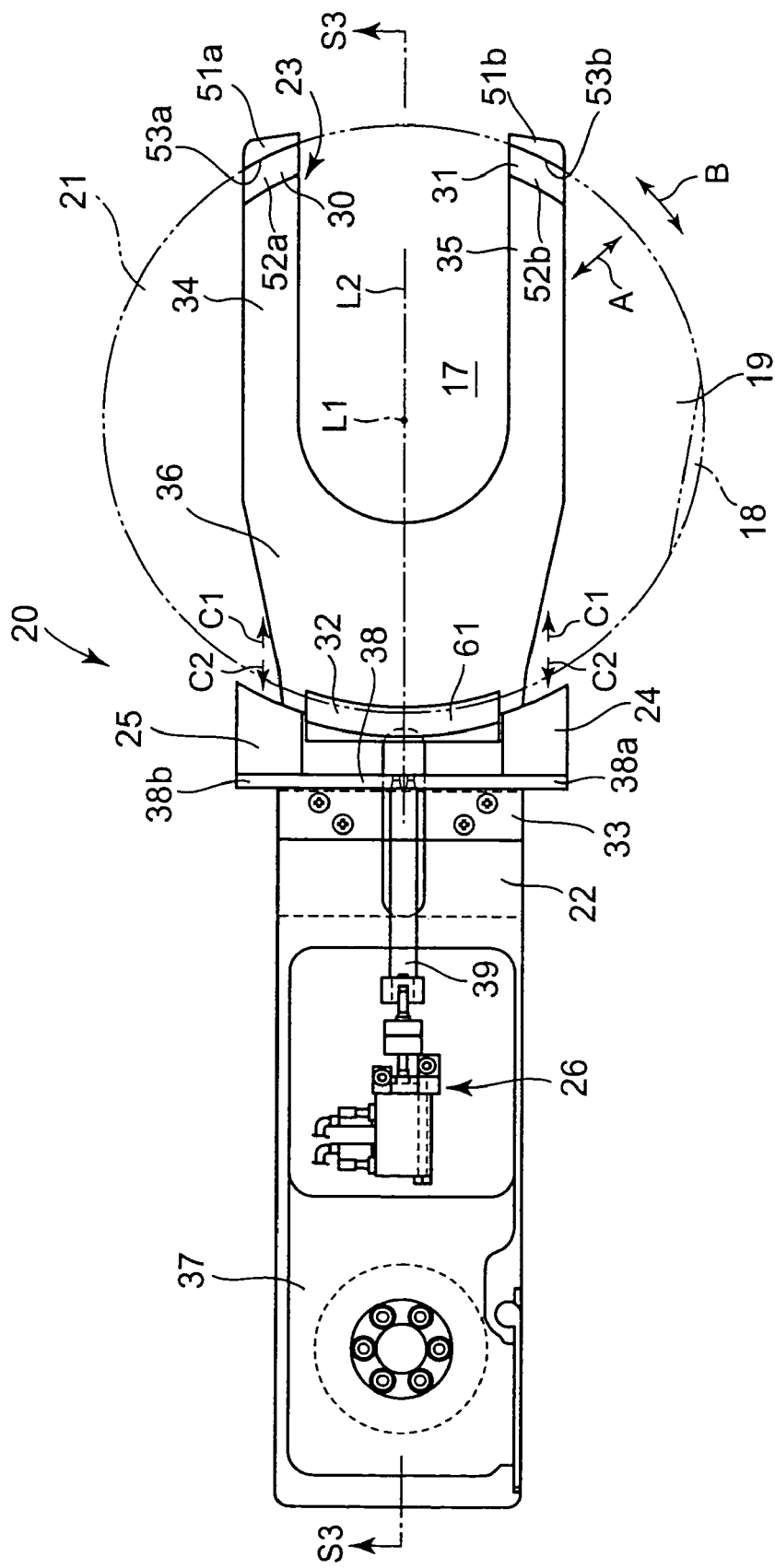
FIG. 1 is a plan view of a robot hand 20, namely, a substrate holding device, in a preferred embodiment according to the present invention.

A robot hand 20, namely, a substrate holding device, in a preferred embodiment according to the present invention will be described with reference to FIGS. 1 to 4.

The robot hand 20 holds a semiconductor wafer 21, namely, a circular substrate. The robot hand 20 is joined to an articulated robot to carry the wafer 21 and to carry the wafer 21 along a predetermined carrying path. The robot hand 20 is built so as to hold the wafer 21 with the axis of the wafer 21 aligned with a predetermined reference axis L1.

The wafer is provided with an orientation flat 19 for positioning. The orientation flat 19 is formed in the wafer 21 by cutting off a segment 18 demarcated by an arc and a cord extending between the opposite ends of the arc from an imaginary circle circumscribed about the wafer 21. When the diameter of the wafer 21 is 200 mm, the segment 18 to be cut off to form the orientation flat 19 has an arc of 60.227 mm in length and a cord of about 59.32 mm in length.

In this specification, a part around the segment 18 will be called the orientation flat 19. The reference axis L1 is vertical. In this specification, a direction in which a radius of an imaginary cylinder equal to that of the wafer 21 extends will be called a radial direction A and a direction along the circumference of the imaginary cylinder will be called a circumferential direction B.

The robot hand 20 includes a hand body 22, a supporting structure 23, a first movable member 24, a second movable member 25, and a hand driving device 26. The hand body 22 has the predetermined reference axis L1 and a longitudinal center axis L2 perpendicular to the reference axis L1. When the robot hand 20 holds the wafer 21, the center axis L2 is horizontal. The hand body 22 has opposite longitudinal end parts, namely, a front part 36 for holding the wafer 21 and a rear part 37 joined to the robot arm.

The front part 36 has a shape substantially resembling the letter U. More concretely, the front part 36 has a base part 33 and two projections 34 and 35, namely, a first projection 34 and a second projection 35, longitudinally extending from the base part 33. The reference axis L1 is at a position between the two projections 34 and 35 and at a distance forward from the base part 33. The hand body 22 is axisymmetrical with respect to the center axis L2.

Figure 2:
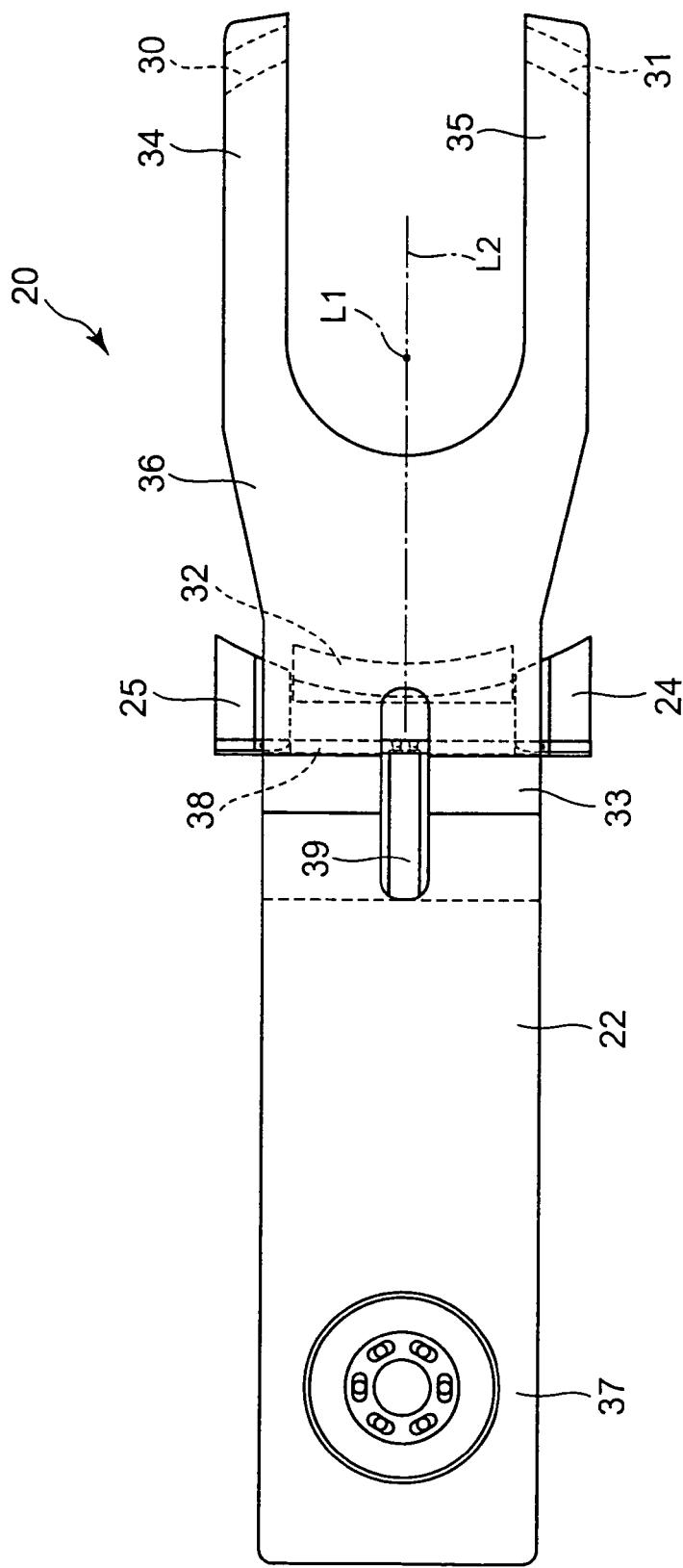
FIG. 2 is a bottom view of the robot hand 20.

As shown in FIGS. 3 and 4, the front part 36 of the hand body 22 has a small thickness, namely, a small dimension along the reference axis L1 and has a shape resembling a blade. As shown in FIGS. 1 and 2, the U-shaped front part 36 defining an open space extending forward from a position near the reference axis L1 along the center axis L2 is formed by cutting off an elongate part of a substantially rectangular plate.

The supporting structure 23 supports the wafer 21 thereon by the circumferential edge of the wafer 21. The supporting structure 23 has three support members, namely, a first support member 30, a second support member 31 and a third support member 32. The first support member 30 and the second support member 31 are attached to the first projection 34 and the second projection 35, respectively, of the hand body 22, and the third support member 32 is attached to the base part 33 of the hand body 22. The support members 30 to 32 are arranged at angular intervals about the reference axis L1. The first support member 30 and the second support member 31, and the third support member 32 are arranged substantially along the center axis L2.

The support members 30 to 32 have support surfaces 52a, 52b and 61, respectively. The wafer 21 is seated on the support surfaces 52a, 52b and 61. The circumferential edge of the wafer 21 supported on the supporting structure 23 are seated on the support surfaces 52a, 52b and 61. Since the support surfaces 52a, 52b and 61 extend in the radial directions A and the circumferential direction B, the wafer 21 supported by the supporting structure 23 can slide in a plane perpendicular to the reference axis L1.

The first support member 30 and the second support member 31 have a first guiding part 51a and a second guiding part 51b, respectively. The guiding parts 51a and 51b protrude upward from the support members 30 and 31, respectively. The guiding parts 51a and 51b have guiding surfaces 53a and 53b, respectively. The guiding surfaces 53a and 53b are in contact with the circumference of an imaginary cylinder having a radius equal to that of the wafer 21 and an axis aligned with the reference axis L1.

The first movable member 24 and the second movable member 25 are movable in an imaginary plane perpendicular to the reference axis L1. More specifically, the movable members 24 and 25 are movable in directions C1 and C2 parallel to the center axis L2. The movable members 24 and 25 are spaced apart with respect to the circumferential direction B and are disposed axisymmetrically with respect to the center line L2. The movable members 24 and 25 are disposed on the circumferentially opposite sides, respective, of the third support member 32. The movable members 24 and 25 face radially inward the circumferential edge of the wafer 21 supported by the supporting structure 23.

The hand driving device 26 drives the movable members 24 and 25 to displace the movable members 24 and 25 simultaneously in the imaginary plane perpendicular to the reference axis L1. More specifically, the hand driving device 26 drives the movable members 24 and 25 to displace the movable members 24 and 25 in the directions C1 and C2 parallel to the center axis L2. Practically, the hand driving device 26 is, for example, a pneumatic cylinder. The pneumatic cylinder is provided with a piston rod that is moved along the center line L2 by compressed air. As shown in FIGS. 3 and 4, the pneumatic cylinder is held in a recess formed in the rear part 37 of the hand body 22.

A connecting rod 39 extending along the center line L2 has a rear end connected to the front end of the piston rod and a front end connected to a horizontal connecting member 38 perpendicular to the center axis L2. The first movable member 24 and the second movable member 25 are connected to the opposite ends 38a and 38b, respectively, of the connecting member 38.

The movable members 24 and 25 move in the direction C1 to approach the reference line L1 when the piston rod is pushed out. The movable members 24 and 25 move in the direction C2 away from the reference line L1 when the piston rod is retracted. The support members 30, 31 and 32, the guiding parts 51a and 51b and the movable members 24 and 25 are made of a synthetic resin.

In a state where the wafer 21 is supported by the support members 30, 31 and 32 such that the orientation flat 19 does not correspond to any one of the first guiding part 51a, the second guiding part 51b, the first movable member 24 and the second movable member 25 as shown in FIG. 1, the movable members 24 and 25 come into contact with the wafer 21 when the hand driving device 26 moves the movable members 24 and 25 in the direction C1. The wafer 21 supported by the supporting structure 23 slides in the radial direction A when the movable members 24 and 25 are moved in the direction C1. Thus the wafer 21 can be brought into contact with the guiding surfaces 53a and 53b of the guiding parts 51a and 51b.

The wafer 21 can be positioned with its axis aligned with the reference axis L1 by bringing the wafer 21 into contact with the guiding parts 51a and 51b. The wafer 21 thus positioned can be held by the cooperative effect of the movable members 24 and 25 and the guiding parts 51a and 51b.

Figure 5:
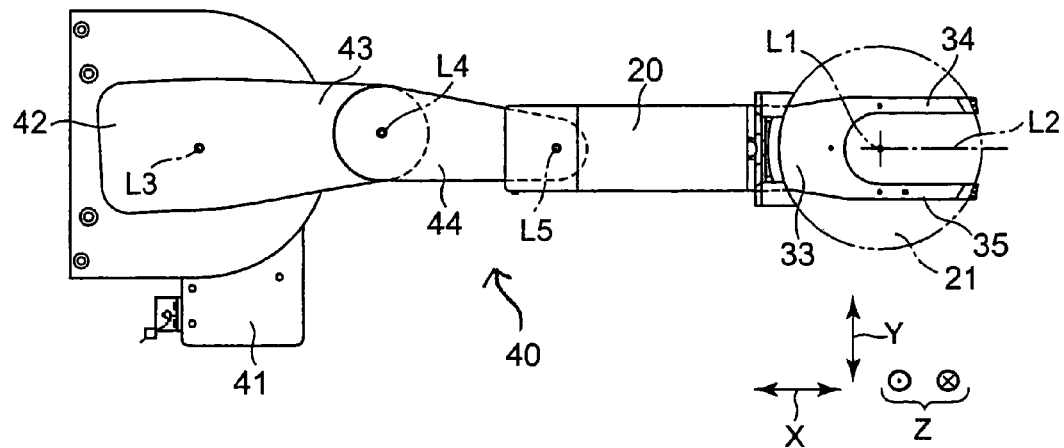
FIG. 5 is a plan view of an articulated robot 40 provided with the robot hand 20.
Figure 6:
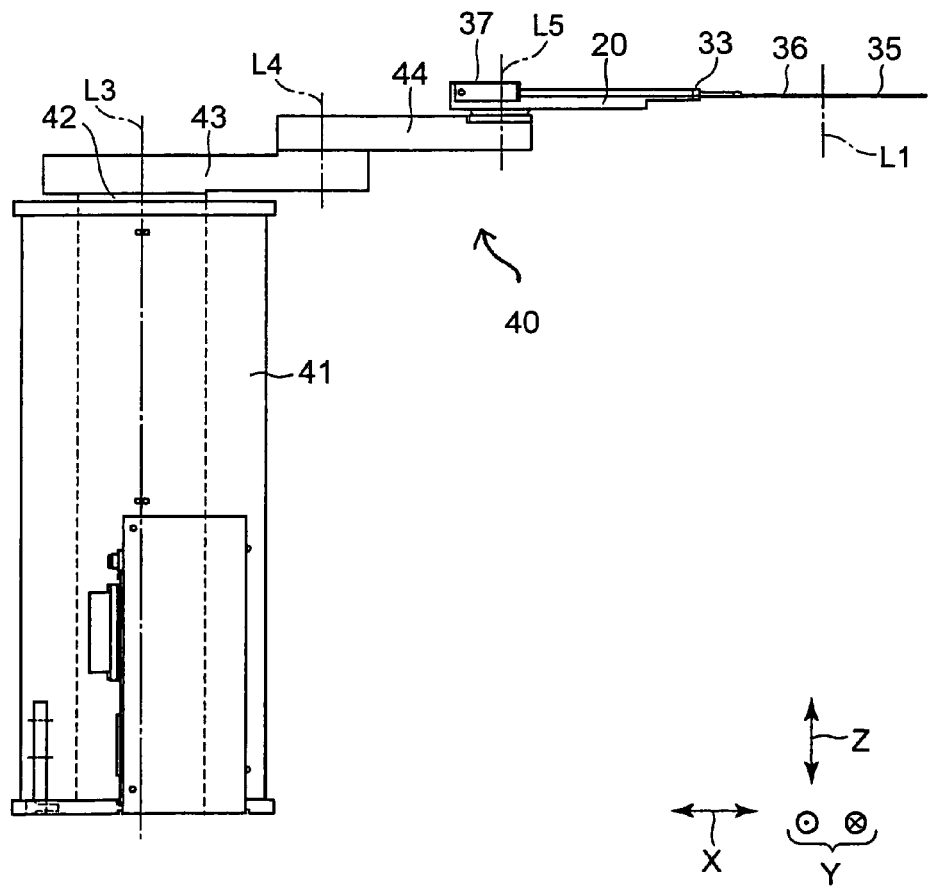
FIG. 6 is a side elevation of the articulated robot 40.

FIGS. 5 and 6 are a plan view and a side elevation, respectively, of the articulated robot 40 provided with the robot hand 20. The articulated robot 40 can move the robot hand 20 in X-, Y- and Z-directions, which are perpendicular to each other.

For example, the articulated robot 40 includes a base unit 41, a base 42, a first arm 43 joined to the base 42, a second arm 44 joined to the first arm 43, and an arm driving device. The base 42 is supported for turning about a predetermined first axis L3 on the base unit 41. The first arm 43 is joined to the base 42 so as to be turnable about a predetermined second axis L4. The second arm 44 is joined to the first arm 43 so as to be turnable about a predetermined third axis L5.

The arm driving device drives the base 42, the first arm 43 and the second arm 44 for turning respectively about the axes L3, L4 and L5. The robot hand 20 is connected to the second arm 44 of the articulated robot 40. The articulated robot 40 can move the robot hand 20 on a cylindrical coordinate system. The robot hand 20 may be connected to any other articulated robot, provided that the articulated robot can move the robot hand 20 along desired moving path.

Figure 7:
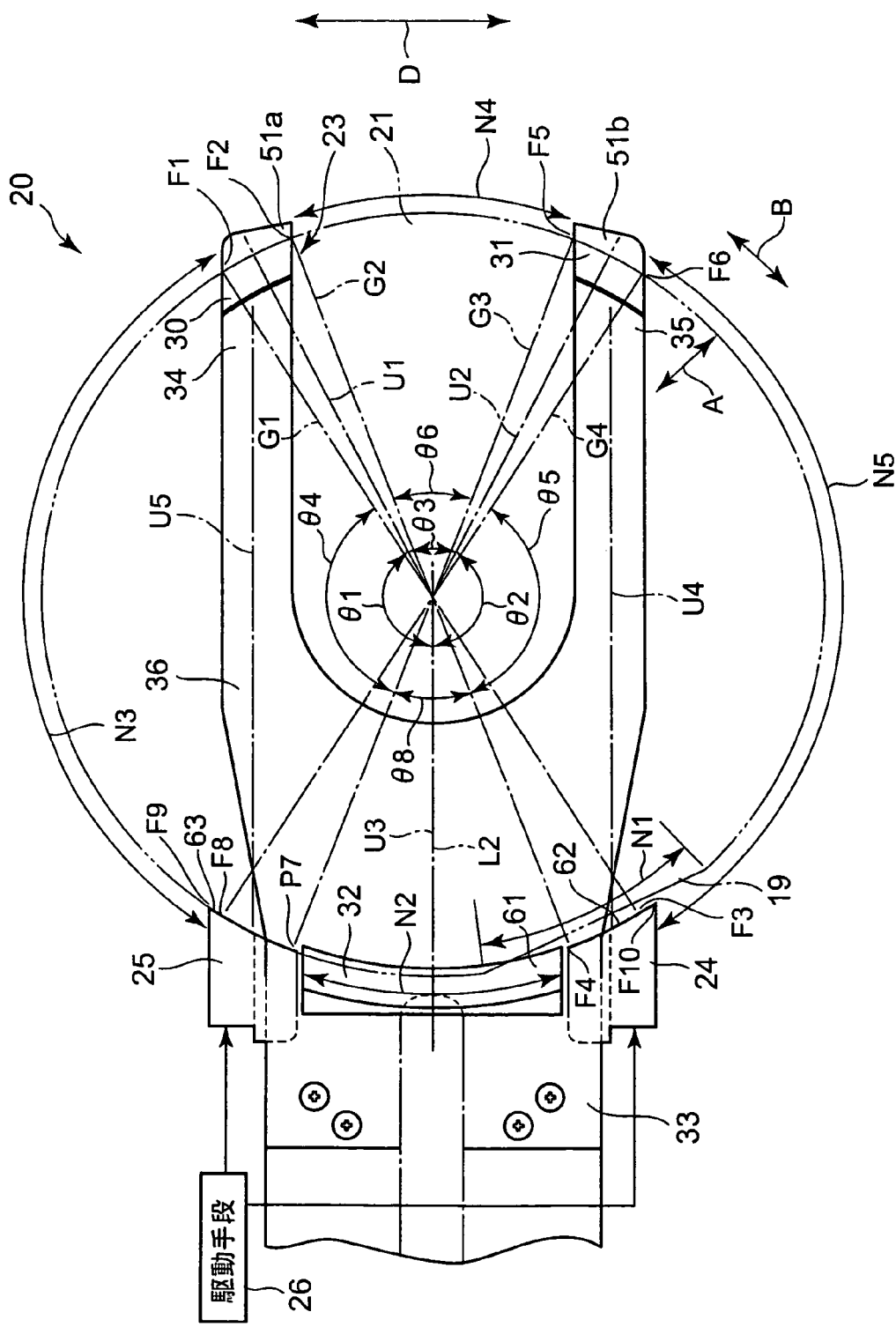
FIG. 7 is an enlarged plan view of a longitudinal end part 36 of the robot hand 20.

FIG. 7 is an enlarged plan view of the front part 36 of the robot hand 20. The first support member 30, the second support member 31 and the third support member 32 are arranged such that angular intervals θ4, θ5 and θ6 between the support members 30 and 32, between the support members 32 and 31 and between the support members 30 and 31 are 180° or below. For example, an angle θ1 between a straight line U1 connecting the circumferential middle of the first support member 30 and the reference axis L1 and a straight line U3 connecting the circumferential middle of the third support member 32 and the reference axis L1 is about 155°, an angle θ2 between a straight line U2 connecting the circumferential middle of the second support member 31 and the reference axis L1 and the straight line U3 connecting the circumferential middle of the third support member 32 and the reference axis L1 is about 155° and an angle θ3 between the straight line U1 connecting the circumferential middle of the first support member 30 and the reference axis L1 and the straight line U2 connecting the circumferential middle of the second support member 31 and the reference axis L1 is about 50°.

The third support member 32 has a circumferential length N2 longer than the circumferential length N1 of the arc of the segment 18 removed to form the orientation flat 19. Therefore, even if the orientation flat 19 is positioned opposite to the third support member 32, the support surface 61 of the third support member 32 can extend circumferentially beyond the end of the segment 18. Thus the third support member 32 can support the wafer 21 regardless of the position of the orientation flat 19 relative to the third support member 32.

Thus the wafer 21 can be supported at least by the third support member 32 and either of the first support member 30 and the second support member 31. For example, if the orientation flat 19 is positioned opposite to the first support member 30, the wafer 21 can be supported by the second support member 31 and the third support member 32. When the orientation flat 19 is positioned opposite to the third support member 32, the wafer 21 can be supported by all the support members 30, 31 and 32.

Intervals in the circumferential direction B between the adjacent ones of the first guiding part 51a, the second guiding part 51b, the first movable member 24 and the second movable member 25 in a state where the wafer 21 is held by at least either of the guiding parts 51a and 51b and either of the movable members 24 and 25 are longer than the circumferential length N1 of the arc of the segment 18 removed to form the orientation flat 19. In other words, circumferential intervals N2 to N5 between the movable members 24 and 25, between the second movable member 25 and the first guiding part 51a, between the guiding parts 51a and 51b and between the second guiding part 51b and the first movable member 24 are greater than the circumferential length N1 of the arc of the segment 18.

Thus the orientation flat 19 of the wafer 21 held by the robot hand 20 is positioned opposite to none or only one of the first guiding part 51a, the second guiding part 51b, the first movable member 24 and the second movable member 25. Therefore, the wafer 21 can be held by at least three of the first guiding part 51a, the second guiding part 51b, the first movable member 24 and the second movable member 25.

The first movable member 24 and the first guiding part 51a are point symmetrical with respect to the reference axis L1.

The second movable member 25 and the second guiding part 51b are point symmetrical with respect to the reference axis L1. A straight line U4 connecting the first guiding part 51a and the second movable member 25 and a straight line U5 connecting the second guiding part 51b and the first movable member 24 are parallel to the center axis L2. Thus the wafer 21 can be restrained from turning about the reference axis L1 by holding the wafer 21 by the movable members 24 and 25 and the guiding parts 51a and 51b.

In a wafer holding state, a straight line G1 passes a first circumferential end F1 of the first guiding part 51a, the reference axis L1 and a first circumferential end F3 of the first movable member 24 and a straight line G2 passes a second circumferential end F2 of the first guiding part 51a, the reference axis L1 and a second circumferential end F4 of the first movable member 24. Similarly, a straight line G3 passes a first circumferential end F5 of the second guiding part 51b, the reference axis L1 and a first circumferential end F7 of the second movable member 25 and a straight line G4 passes a second circumferential end F6 of the second guiding part 51b, the reference axis L1 and a second circumferential end F8 of the second movable member 25. In other words, the angular interval between the second circumferential end F2 of the first guiding part 51a and a circumferential end F10 of the first movable member 24 is 180° or below, and the angular interval between the first circumferential end F5 of the second guiding part 51b and a circumferential end part F9 of the second movable member 25 is 180° or below.

Thus the wafer 21 can be immovably positioned in alignment with the reference axis L1 by the three of the guiding parts 51a and 51b and the movable members 24 and 25.

The dislocation of the wafer 21 from a position where the wafer 21 is aligned with the reference axis L1 can be further surely avoided by simultaneously moving the first movable member 24 and the second movable member 25 so as to push the wafer 21. The robot hand 20 can be formed in a small width, namely, a dimension with respect to lateral directions D perpendicular to the reference axis L1 and the center axis L2, by disposing the first movable member 24 and the second movable member 25 close to the third support member 32 on the circumferentially opposite sides, respectively, of the third support member 32. A component force acting on the wafer 21 in a direction to dislocate the wafer 21 when the movable members 24 and 25 push the wafer 21 in the direction C1 can be reduced and the dislocation of the wafer 21 can be prevented.

The present invention also includes an arrangement where the first guiding part 51a and the first movable member 24 are not point symmetrical with respect to the reference axis L1. The straight line U4 connecting the first guiding part 51a and the second movable member 25 and the straight line U5 connecting the second guiding part 51b and the first movable member 24 need not necessarily be parallel to the center axis L2.

Figure 8:
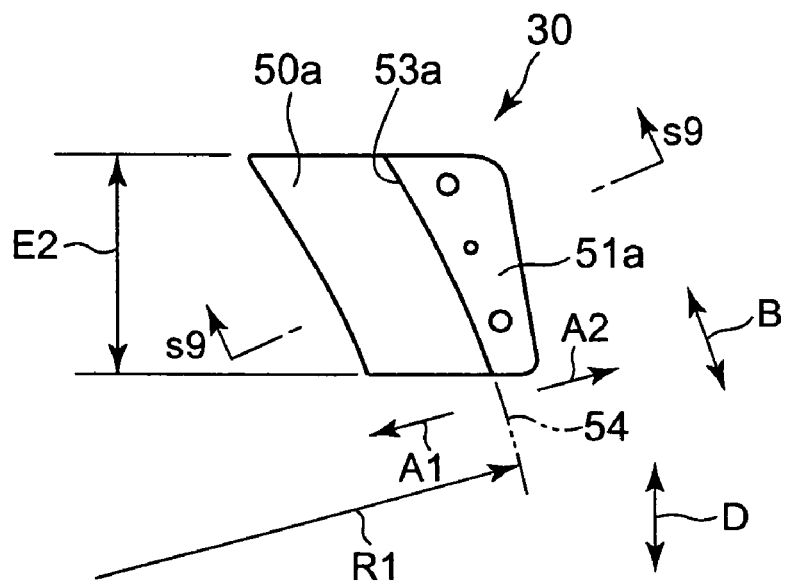
FIG. 8 is a plan view of a first support member 30.
Figure 9:
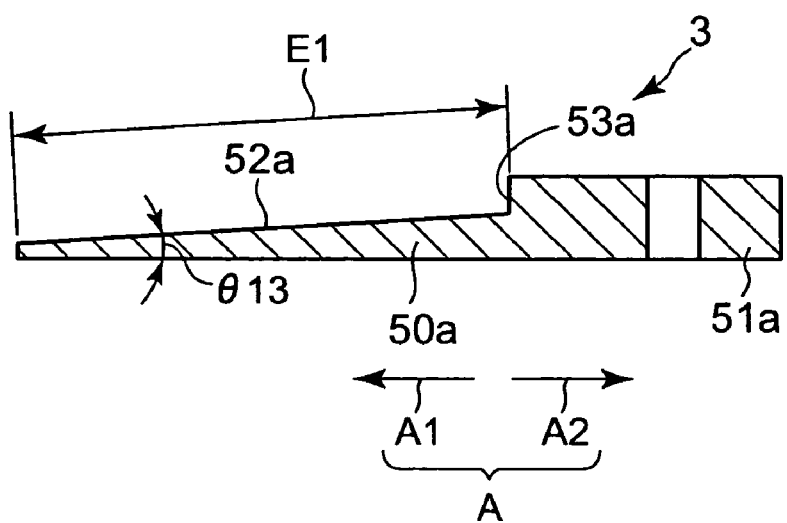
FIG. 9 is a sectional view taken on the line S9-S9 in FIG. 8.

FIG. 8 is a plan view of the first support member 30 and FIG. 9 is a sectional view taken on the line S9-S9 in FIG. 8. The first support member 30 is connected to the first projection 34 of the hand body 22. The first support member 30 has a first rest part 50a facing the lower surface of a circumferential edge of the wafer 21, and the first guiding part 51a for positioning the wafer 21.

The first rest part 50a extends in a radially inward direction A1 from a circular arc 54 of a circle having its center on the reference axis L1 and having a radius equal to the radius R1 of the wafer 21. The first guide part 51a extends in a radially outward direction A2 from the circular arc 54 having its center on the reference axis L1 and having a radius equal to the radius R1 of the wafer 21.

The upper surface of the first rest part 50a is a first support surface 52a on which the wafer 21 is supported. The first support surface 52a slopes at a predetermined inclination θ13 to a horizontal plane. The first support surface 52a slopes up in the radially outward direction A2. For example, the first support surface 52a is inclined to a horizontal plane. The first support surface 52a extends in the radial direction A and the circumferential direction B. For example, the first support surface 52a has a radial width E1 of about 10 mm and a circumferential width E2 of about 18 mm. Since the first support surface 52a extends in the radial direction A and the circumferential direction B, even when the wafer 21 is slightly dislocated, the wafer 21 can be mounted on the first rest part 50a, and the wafer 21 can be moved in the radial direction A on the first rest part 50a.

The first guiding part 51a is continuous with the first rest part 50a. The first guiding part 51a has the first guiding surface 53a rising from the radially outer side of the first support surface 52a. The first guiding surface 53a is a part of the circumference of the imaginary cylinder having a radius equal to that of the wafer 21 and a center axis aligned with the reference axis L1. In this embodiment, the radius of curvature of the first guiding surface 53a is substantially equal to the radius of the wafer 21. The width E2 of the first guiding surface 53a is substantially equal to that of the first support surface 52a.

Figure 10:
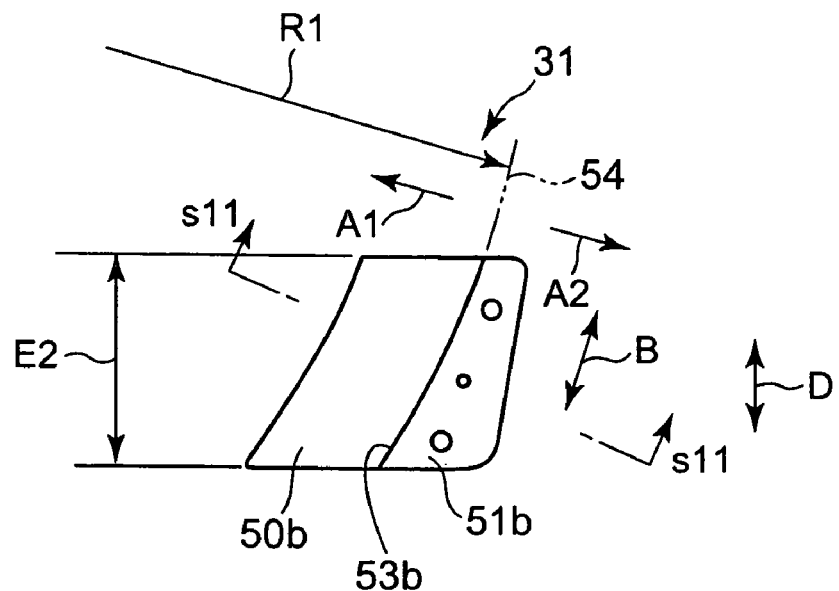
FIG. 10 is a plan view of a second support member 31.
Figure 11:
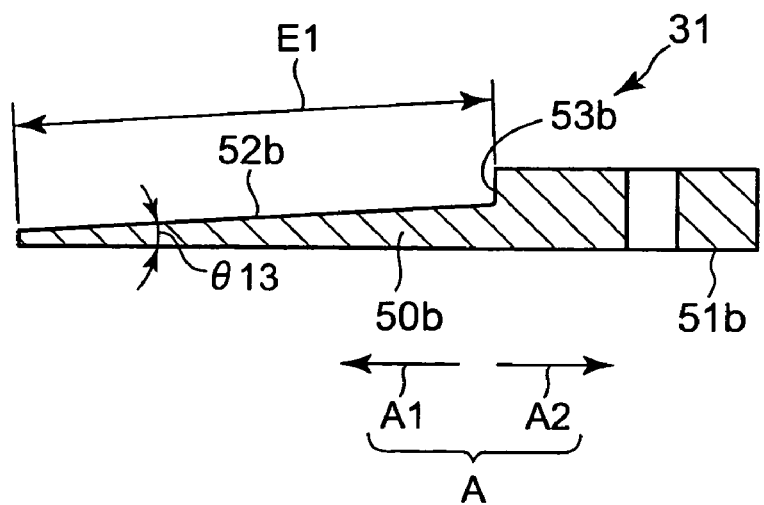
FIG. 11 is a sectional view taken on the line S11-S11 in FIG. 10.

FIG. 10 is a plan view of the second support member 31 and FIG. 11 is a sectional view taken on the line S11-S11 in FIG. 10. The second support member 31 is connected to the second projection 35 of the hand body 22. The second support member 31 has a second rest part 50b facing the lower surface of a circumferential edge of the wafer 21, and the second guiding part 51b for positioning the wafer 21.

The first support member 30 and the second support member 31 are disposed in an axisymmetrical positional relation with respect to the center line L2. The second rest part 50b has a second support surface 52b. The second guiding part 51b has a second guiding surface 53b. The second support member 31 is similar in construction to the first support member 30 and hence the further description of the second support surface 52b and the second guiding surface 53b will be omitted.

Figure 12:
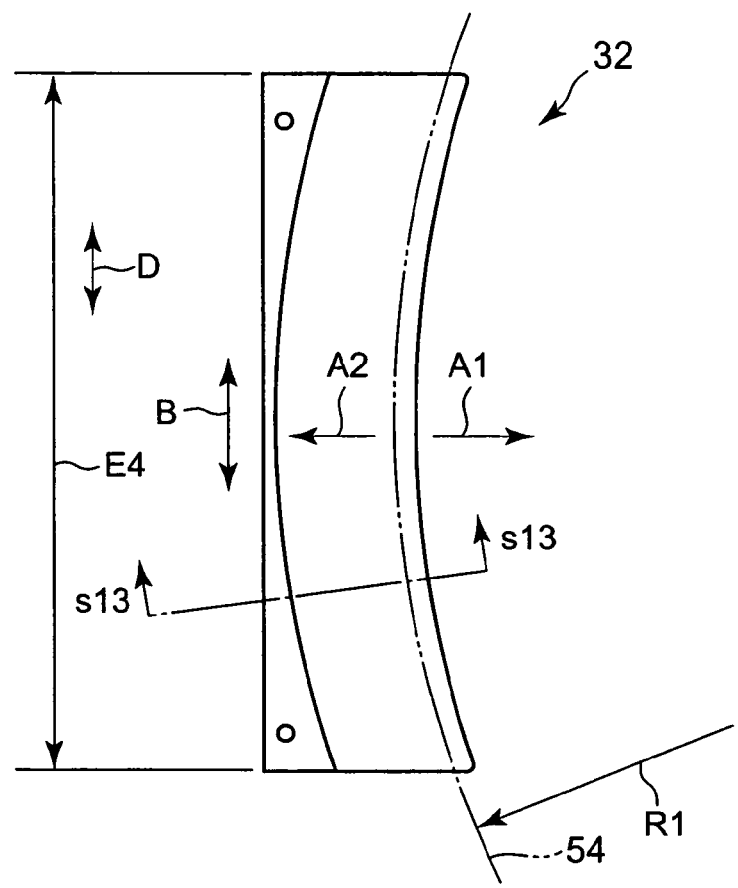
FIG. 12 is a plan view of a third support member 32.
Figure 13:
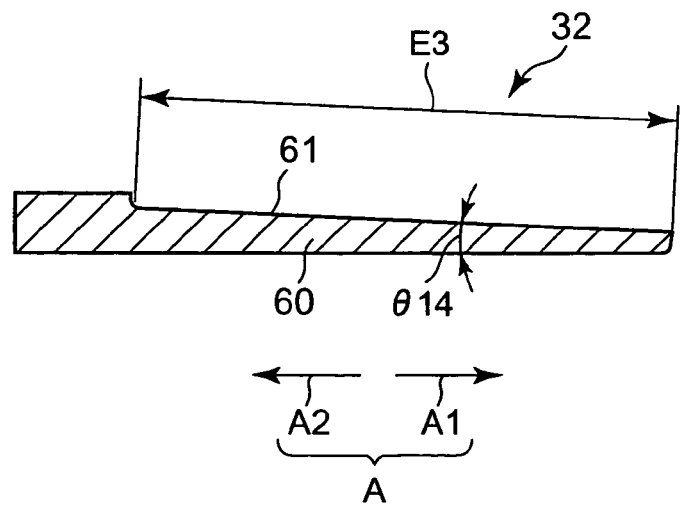
FIG. 13 is a sectional view taken on the line S13-S13 in FIG. 12.

FIG. 12 is a plan view of the third support member 32 and FIG. 13 is a sectional view taken on the line S13-S13 in FIG. 12. The third support member 32 has a third rest part 60 facing the lower surface of a circumferential edge of the wafer 21. The third rest part 60 extends in both a region extending in the radially inward direction A1 from an arc 54 of a circle having a radius equal to the radius R1 of the wafer 21 and its center on the reference axis L1 and a region extending in the radially outward direction A2 from the arc 54.

The third rest part 60 has a third support surface 61 inclined at a predetermined inclination θ14 to a horizontal plane. The third support surface 61 slopes up in the radially outward direction A2. For example, the third support surface 61 inclines to a horizontal plane. The third support surface 61 extends in the radial direction A and the circumferential direction B. For example, the third support surface 61 has a radial width E3 of about 12 mm and a circumferential width E4 of about 64 mm. Since the third support surface 61 extends in both the radial direction A and the circumferential direction B, the wafer 21 can be supported on the third support surface 61 even if the wafer 21 is slightly dislocated or the wafer 21 is moved in the radial direction A.

The respective support surfaces 52a, 52b and 61 of the support members 30, 31 and 32 are inclined. Therefore, the circumferential edge of the wafer 21 is in line or point contact with the support surfaces 52a, 52b and 61 when the supporting structure 23 supports the wafer 21. Thus only small parts of the wafer 21 are in contact with the supporting structure 23 and the contamination of the wafer 21 can be prevented.

Figure 14:
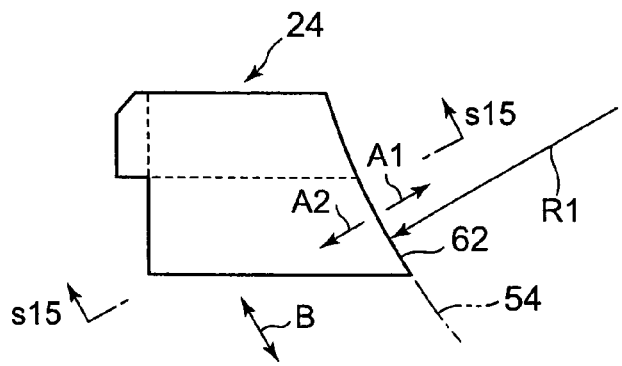
FIG. 14 is a plan view of a first movable member 24.
Figure 15:
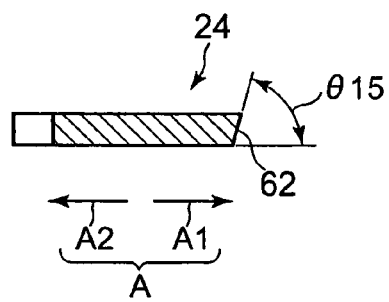
FIG. 15 is a sectional view taken on the line S15-S15 in FIG. 12.

FIG. 14 is a plan view of the first movable member 24 and FIG. 15 is a sectional view taken on the line S15-S15 in FIG. 14. The first movable member 24 has a first pressing surface 62 facing the circumferential edge of the wafer 21 from a radially outward direction. The first pressing surface 62 has a radius of curvature substantially equal to the radius of the wafer 21. The first pressing surface 62 extends along the arc 54 of a circle having its center on the reference axis L1 and having a radius equal to the radius R1 of the wafer 21. The first pressing surface 62 is inclined at a predetermined inclination θ15 to a horizontal plane. The first pressing surface 62 slopes down in the radially outward direction A1. For example, the first pressing surface 62 inclined at 75° to a horizontal plane.

Figure 16:
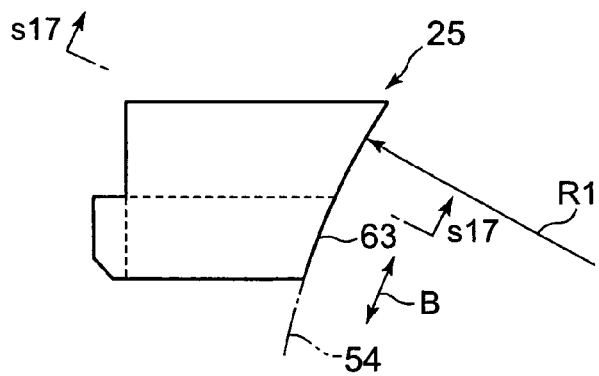
FIG. 16 is a plan view of a second movable member 25.
Figure 17:
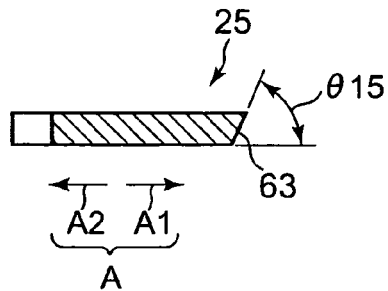
FIG. 17 is a sectional view taken on the line S17-S17 in FIG. 16.

FIG. 16 is a plan view of the second movable member 25 and FIG. 17 is a sectional view taken on the line S17-S17 in FIG. 16. The first movable member 24 and the second movable member 25 are disposed in an axisymmetrical positional relation with respect to the center axis L2. The second movable member 25 has a second pressing surface 63. Since the second movable member 25 is similar in construction as the first movable member 24 and hence the further description thereof will be omitted.

The respective pressing surfaces 62 and 63 of the movable members 24 and 25 are thus inclined. Therefore, the pressing surfaces 62 and 63 of the movable members 24 and 25 come into line or point contact with the circumferential edge of the wafer 21 to push the wafer 21. Thus only small parts of the wafer 21 are in contact with the movable members 24 and 25 and the contamination of the wafer 21 can be prevented.

Figure 18:
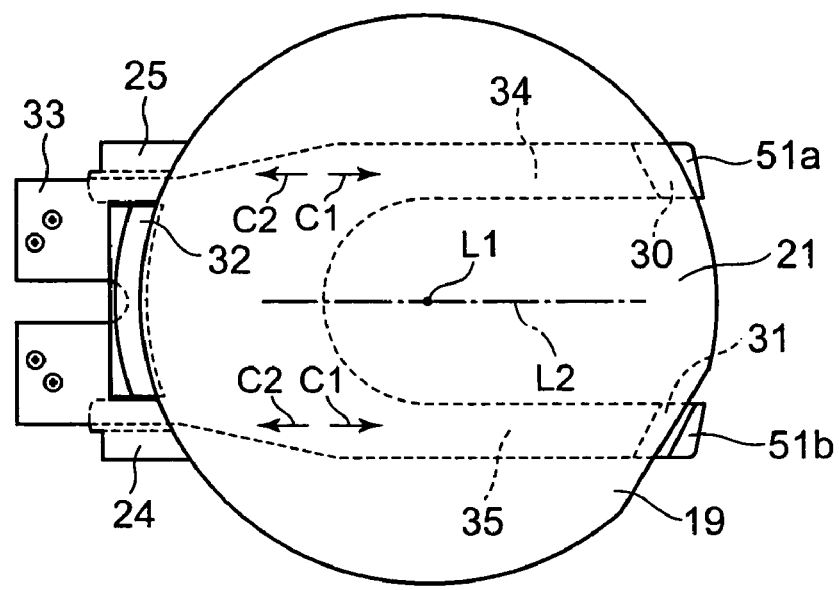
FIG. 18 is a plan view of a semiconductor wafer 21 held with an orientation flat 19 thereof coincided with the second support member 31.

FIG. 18 is a plan view of the wafer 21 disposed with its orientation flat 19 coincided with the second support member 31. When the orientation flat 19 coincides with the second support member 31, the first support member 30 and the third support member 32 can support the wafer 21. Since the support members 30, 31 and 32 extend in wide regions, respectively, as mentioned above, the first support member 30 and the third support member 32 can support the wafer 21 even if the wafer 21 is dislocated.

When the first movable member 24 and the second movable member 25 are moved along the center axis L2 in the direction C1, both the first movable member 24 and the second movable member 25 come into contact with the circumferential edge of the wafer 21. Even if the wafer 21 is dislocated from a correct position and only the movable member 24 or 25 comes into contact with the substrate 21 before the other movable member comes into contact with the wafer 21, both the first movable member 24 and the second movable member 25 come into contact with the wafer 21 as the wafer 21 is displaced along the center axis L2. The axis of the wafer 21 intersects the center axis L2 after both the first movable member 24 and the second movable member 25 have come into contact with the wafer 21.

As the wafer 21 moves together with the first movable member 24 and the second movable member 25, the circumferential edge of the wafer 21 comes into contact with the first guiding part 51a so that the wafer 21 is held with its axis aligned with the reference axis L1. Since the first movable member 24 and the first guiding part 51a are point symmetrical with respect to the reference axis L1, the wafer 21 will not be dislocated from the correct position where the axis of the wafer 21 is aligned with the reference axis L1 and the wafer 21 can be securely held.

In a state where the wafer 21 is held on the robot hand 20, the wafer 21 is seated on the third support member 32 and the first movable member 24 and the second movable member 25 on the opposite sides of the third support member 32 depress the wafer 21. The movable members 24 and 25 and the guiding parts 51a and 51b restrain the wafer 21 from movement in the radial direction A and the movable members 24 and 25 and the rest parts 50a and 50b restrains the wafer 21 from vertical movement. Thus the wafer can be surely held.

The wafer 21 is prevented from falling off the robot hand 20 by restraining the wafer 21 from vertical movement on the robot hand 20. The robot hand 20 can be formed in small dimensions by disposing the first movable member 24 and the second movable member 25 at a small circumferential interval.

An operation for positioning and holding the wafer 21 in a state where the orientation flat 19 is coincided with the second guiding member 51b has been described. The wafer 21 can be positioned and held by a similar operation in a state where the orientation flat 19 is coincided with the first guiding member 51a.

Figure 19:
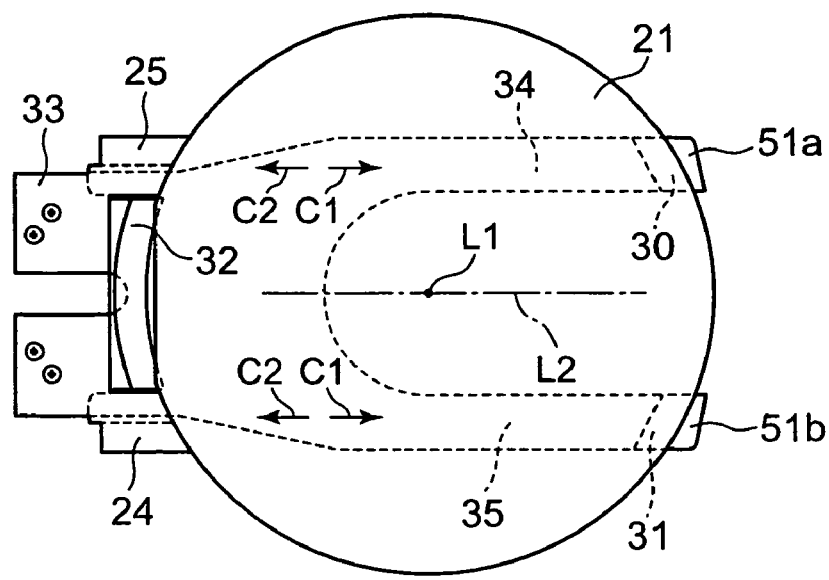
FIG. 19 is a plan view of a semiconductor wafer 21 held with an orientation flat 19 thereof coincided with the third support member 32.

FIG. 19 is a plan view of the wafer 21 disposed with its orientation flat 19 coincided with the third support member 32. The third support member 32 has the third support surface 61 of an area sufficient for supporting the wafer 21 thereon even if the orientation flat 19 coincides with the third support member 32. Thus the wafer 21 can be supported on the supporting structure comprising the support members 30, 31 and 32.

In this state, the first movable member 24 and the second movable member 25 come into contact with the wafer 21 and move the wafer 21 in the direction C1. Consequently, the circumferential edge of the wafer 21 comes into contact with the first guiding part 51a and the second guiding part 51b. Thus the wafer 21 can be positioned and held with its axis aligned with the reference axis L1.

The first guiding part 51a and the first movable member 24 are point symmetrical with respect to the reference axis L1 and the second guiding part 51b and the second movable member 25 are point symmetrical with respect to the reference axis L1. Therefore, the wafer 21 will not be dislocated from the correct position where the axis of the wafer 21 is aligned with the reference axis L1 so that the wafer 21 can be securely held. The effect of the robot hand 20 in this state is similar to that of the robot hand 20 in the state shown in FIG. 18.

An operation for positioning and holding the wafer 21 in a state where the orientation flat 19 is coincided with the third support member 32 has been described. The wafer 21 can be positioned and held by a similar operation in a state where the orientation flat 19 is coincided with any one of the first guiding member 51a, the first movable member 24 and the second movable member 25.

Figure 20:
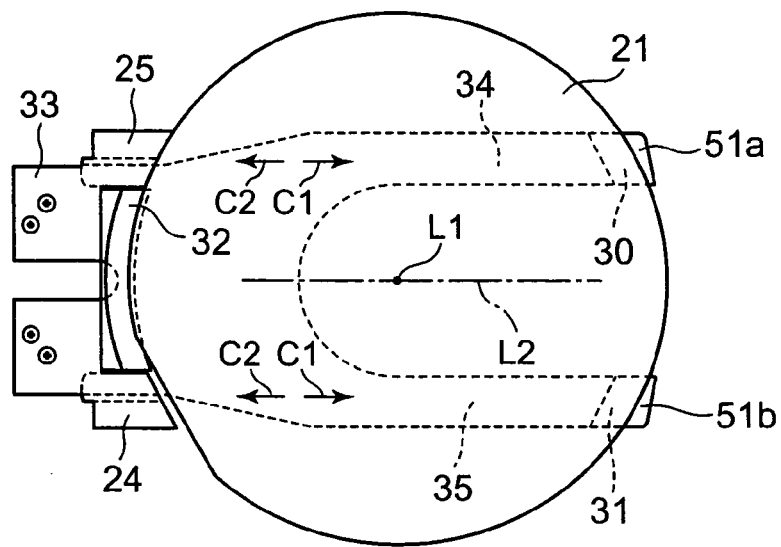
FIG. 20 is a plan view of a semiconductor wafer 21 held with an orientation flat 19 thereof coincided with the first movable member 24.

FIG. 20 is a plan view of the wafer 21 disposed with its orientation flat 19 coincided with the first movable member 24. The wafer 21 can be supported on the support members 30, 31 and 32 in the state shown in FIG. 20.

As the first movable member 24 and the second movable member 25 move in the direction C1, the second movable member 25 comes into contact with the circumferential edge of the wafer 21. When the second movable member 25 is moved further in the direction C1 to press the wafer 21 against the first guiding part 51a and the second guiding part 51b, the wafer 21 is positioned and held with its axis aligned with the reference axis L1. Other effects are similar to those mentioned above in connection with FIG. 18.

An operation for positioning and holding the wafer 21 in a state where the orientation flat 19 is coincided with the first movable member 24 has been described. The wafer 21 can be positioned and held by a similar operation in a state where the orientation flat 19 is coincided with the second movable member 25. Thus the robot hand 20 can position and hold the wafer regardless of the position of the orientation flat 19 simply by moving the movable members 24 and 25 in the direction parallel to the center line L2. In other words, complicated mechanisms and special control operations are not necessary even if the position of the orientation flat 19 relative to the robot hand 20 is not fixed.

The wafer 21 can be positioned by moving the wafer 21 after placing the wafer 21 on the support members 30, 31 and 32 of the supporting structure 23, even if the wafer 21 is not placed on the supporting structure 23 at the accurate position. Therefore, the movement position to which the robot hand 20 is moved can be determined as any positions where the wafer 21 can be placed on the supporting structure 23, thereby, the movement position of the robot hand 20 does not need to be accurately determined.

The robot hand 20 in the preferred embodiment can accurately center and hold the semiconductor wafer 21 even if the wafer 21 is a semiconductor wafer 21 provided with an orientation flat 19 without touching any parts of the wafer 21 other than the circumferential edge of the wafer 21.

The wafer 21 can be positioned and held simply by moving the first movable member 24 and the second movable member 25 and any complicated control operations are unnecessary. Even when the wafer 21 is held by either of the movable members 24 and 25 and either of the guiding parts 51a and 51b, the breakage of the wafer 21 can be prevented by using a pneumatic cylinder as the hand driving device 26 and by properly setting the pressure of the compressed air supplied to the pneumatic cylinder.

The wafer 21 can be placed on the supporting structure 23 even if the wafer 21 is slightly dislocated. Therefore, the wafer can be accurately positioned and held by the robot hand even if a position where the robot hand is supposed to be positioned to receive the wafer 21 is not accurately taught. Moreover, even if wafers 21 are contained in a wafer cassette in a state that the wafers 21 are not accurately aligned with respect to their reference axes, a wafer 21 can be accurately positioned and held.

The front part 36 of the hand body 22 has the shape of a thin blade. The supporting structure 23, the guiding parts 51a and 51b and the movable members 24 and 25 have small vertical dimensions, respectively. Therefore, the projections 34 and 35 of the hand body 22 can be inserted into a space between adjacent ones of wafers arranged at small pitches in a cassette and the robot hand 20 can hold a wafer 21. At least three ones of the guiding members 51a and 51b and the movable members 24 and 25 of the robot hand 20 come into contact with the wafer 21. The robot hand 20 does not need five or more members that can come into contact with the wafer 21 and hence the robot hand 20 is simple in construction.

Figure 21:
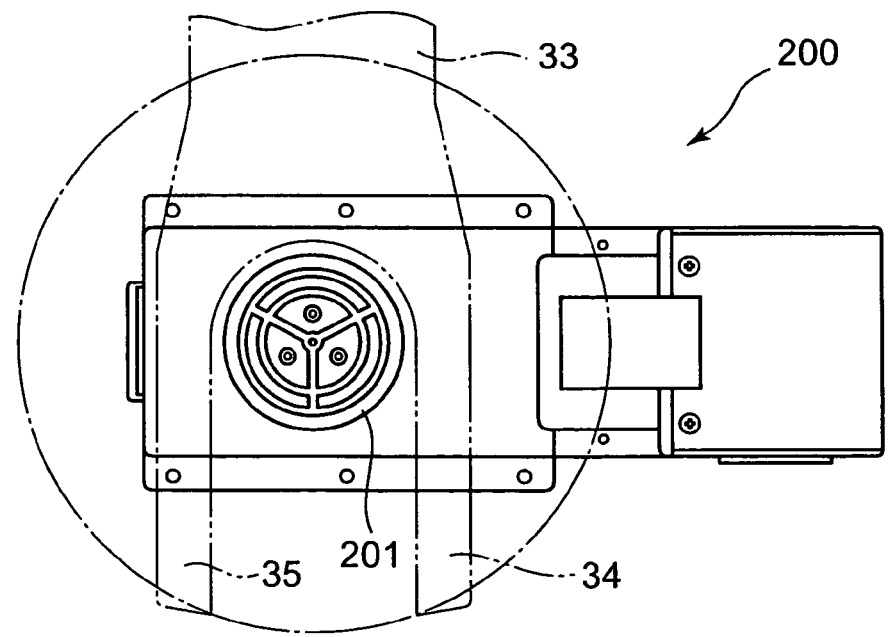
FIG. 21 is a plan view of an aligner 200 for positioning a wafer.
Figure 22:
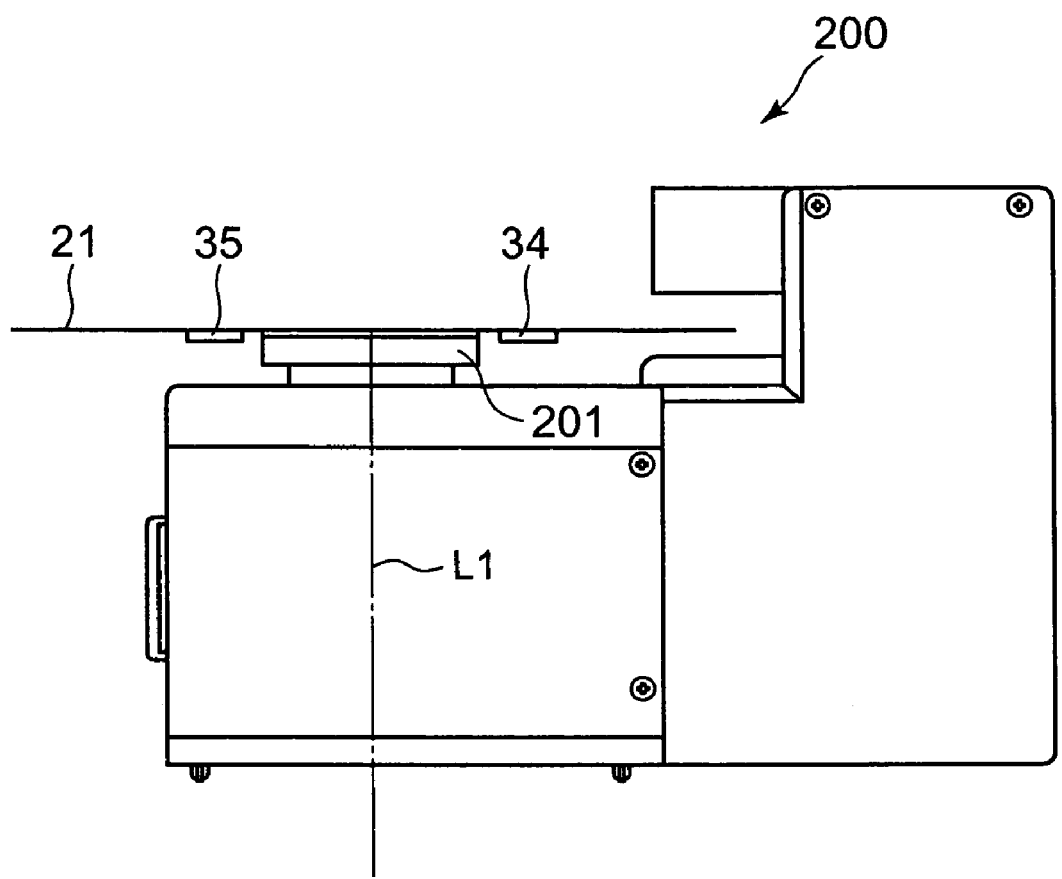
FIG. 22 is a side elevation of a wafer 21 positioned on the aligner 200 by the robot hand 20.

FIG. 21 is a plan view of an aligner 200 for positioning a wafer and FIG. 22 is a side elevation of the aligner 200 in a state where a wafer 21 is placed on the aligner 200 by the robot hand 20. For example, the aligner 200 is provided with a suction shaft 201 for holding the wafer 21 placed thereon by suction. The aligner 200 attracts and holds the wafer 21 positioned with its axis aligned with the axis of the suction shaft 201 by suction. The aligner 200 turns the wafer 21 about its axis to detect the orientation flat 19. Then, the aligner 200 turns the wafer 21 to position the wafer 21 on the basis of the angular position of the detected orientation flat 19 so that the orientation flat 19 may be positioned at a predetermined angular position.

The hand body 22 of the robot hand 20 of the present invention is U-shaped and defines an open space 17 extending from the reference axis L1 in the radially outward direction A to open outward. Thus the robot hand 20 can place the wafer 21 close to the suction shaft 201 with the axis of the wafer 21 aligned with the axis of the suction shaft 201 without colliding against the suction shaft 201.

The robot hand 20 can correctly position the wafer 21 relative to the aligner 200 and can place the wafer 20 on the suction shaft 201. Since the wafer 21 is thus prevented from decentering relative to the aligner 200, the aligner 200 can correctly determine the position of the orientation flat 19. Moreover, change of the position of the wafer 21 due to the decentering of the wafer 21 can be prevented when the wafer 21 is removed from the aligner 200 after the adjustment of the position of the wafer 21 by the aligner 200. Thus a situation where the robot hand 20 cannot hold the wafer 21 positioned by the aligner 200 can be avoided. As mentioned above, the robot hand 20 of the present invention can load the wafer 21 into a device provided with a holding shaft for coaxially holding the wafer 21 and can unload the wafer 21 from the device. Thus the convenience can be further improved.

The embodiment of the present invention specifically described herein is only an example and changes can be made therein without departing from the scope of the invention. For example, although the robot hand 20 has been described as applied to holding the semiconductor wafer 21, the robot hand 20 can position and hold any workpiece other than the semiconductor wafer 21, provided that the workpiece has the shape of a disk. Although the first support member 30 has the first guiding part 51a and the second support member 31 has the second guiding part 51b in the foregoing robot hand 20, the robot hand 20 may be separately provided with the support members 30, 31 and 32 and the guiding parts 51a and 51b.

When the robot hand 20 is not used for carrying the wafer 21 to the aligner 200 or the like, the hand body 22 does not need to have the U-shape. The cut part of the substrate may be other than the orientation flat. Although the guiding surfaces 53a and 53b and the pressing surfaces 62 and 63 in the foregoing embodiment are supposed to be curved surfaces of a radius of curvature equal to the radius of the wafer 21, those surfaces do not need to be curved surfaces, provided that those surfaces can come into contact with the circumference of an imaginary cylinder having an axis aligned with the reference axis and a radius equal to that of the wafer 21 in a substrate holding state.

Although the invention has been described in its preferred embodiment with a certain degree of particularity, obviously many changes and variations are possible thereon. It is therefore to be understood that the present invention can be practiced otherwise than as specifically described herein without departing from the scope and spirit thereof.

The invention claimed is:

1. A substrate holding device for holding a substantially circular substrate having a circumferential cut part, comprising:
   a hand body having a predetermined reference axis;
   a supporting structure mounted on the hand body so as to face a circumferential edge of the substrate from below the substrate to support the substrate;
   first and second guiding members mounted on the hand body and respectively having guiding surfaces which are in contact with an imaginary cylinder having an axis aligned with the reference axis and having a radius equal to a radius of the substrate;

first and second movable members capable of moving in an imaginary plane perpendicular to the reference axis and disposed on a radially outer side of the circumferential edge of the substrate so as to face the circumferential edge of the substrate; and driving means configured to simultaneously displace the first movable member and the second movable member in the imaginary plane, wherein the first guiding member, the second guiding member, the first movable member and the second movable member are spaced apart on a circumference of the imaginary cylinder at circumferential intervals each of which is greater than a length of an arc of a segment cut to form the circumferential cut part in a substrate holding state where the substrate is held by at least either of the first and the second guiding members and at least either of the first and the second movable members, wherein the first guiding member and the first movable member are disposed in a point symmetrical positional relation with respect to the reference axis in the substrate holding state, wherein the second guiding member and the second movable member are disposed in a point symmetrical positional relation with respect to the reference axis in the substrate holding state, wherein a straight line extending between the first guiding member and the second movable member and a straight line extending between the second guiding member and the first movable member are disposed so as to be parallel to moving directions of the first and the second movable members in the substrate holding state, wherein the supporting structure includes three support members to be brought into contact with the substrate, the support members being respectively arranged around the reference axis at angular intervals of 180° or below, the first and the second movable members being disposed on circumferentially opposite sides, respectively, of one of the three support members, the first and the second guiding members being respectively mounted on remaining two support members, wherein each of the first and the second movable members has a pressing surface having a radius of curvature substantially equal to the radius of the substrate and facing the circumferential edge of the substrate from the radially outer side of the substrate, the pressing surfaces extending along the circumference of the imaginary cylinder in the substrate holding state, and wherein at least one of the first and the second movable members contacts the substrate along a substantially similar distance to which at least one of the first and the second guiding members contacts the substrate.

2. The substrate holding device according to claim 1, wherein each of the guiding surfaces of the first and the second guiding members has a radius of curvature substantially equal to the radius of the substrate and extends along the circumference of the imaginary cylinder.

3. The substrate holding device according to claim 1, wherein:

the supporting structure has a support surface for supporting the substrate thereon, the support surface sloping up outward along the radius of the imaginary cylinder, and each of the first and the second movable members has a pressing surface to be pressed against the substrate, the pressing surface sloping down outward along the radius of the imaginary cylinder.

4. The substrate holding device according to claim 3, wherein an open space is formed so as to open radially outward from the reference axis.

5. The substrate holding device according to claim 1, wherein an open space is formed so as to open radially outward from the reference axis.

6. The substrate holding device according to claim 1, wherein one of the three support members has a support surface of a circumferential length longer than the length of the arc of the segment cut off to form the circumferential cut part.

7. The substrate holding device according to claim 6, wherein the length of the arc of the segment is about 60.227 mm.

* * * * *